(12) United States Patent
Tzu et al.

(10) Patent No.: US 6,251,547 B1
(45) Date of Patent: Jun. 26, 2001

(54) SIMPLIFIED PROCESS FOR MAKING AN OUTRIGGER TYPE PHASE SHIFT MASK

(75) Inventors: San-De Tzu, Taipei; Chia-Hui Lin, Hsin-Chu; Wei-Zen Chou, Taipei, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/422,180

(22) Filed: Oct. 22, 1999

(51) Int. Cl.[7] .................. G03F 9/00; G03C 5/00
(52) U.S. Cl. ................ 430/5; 430/296; 430/394
(58) Field of Search ..................... 430/5, 296, 322, 430/394

(56) References Cited

U.S. PATENT DOCUMENTS

| | | | |
|---|---|---|---|
| 5,604,081 | * 2/1997 | Stoll | 430/394 |
| 5,853,921 | 12/1998 | Moon et al. | 430/5 |
| 5,853,923 | 12/1998 | Tzu | 430/5 |
| 5,856,049 | 1/1999 | Lee | 430/5 |
| 5,888,678 | 3/1999 | Tzu et al. | 430/5 |

* cited by examiner

*Primary Examiner*—S. Rosasco
(74) *Attorney, Agent, or Firm*—George O. Saile; Stephen B. Ackerman

(57) ABSTRACT

A simple, cost-effective method for forming a lithography mask with a directly imaged portion and an attenuated, phase shifted portion. In particular, the use of such a method for forming an outrigger-type phase shift mask. The mask is formed on a blank consisting of a transparent quartz substrate over which is an attenuating phase shift layer and an optically opaque layer, by a process that produces a pattern in an E-beam sensitive resist with two different E-beam energy depositions. The higher energy deposition is used to form the main pattern, while the lower energy deposition forms the pattern for the outrigger.

30 Claims, 3 Drawing Sheets

SIMPLIFIED PROCESS FOR MAKING AN OUTRIGGER TYPE PHASE SHIFT MASK

BACKGROUND OF THE INVENTION

1. Field of the Invention

This invention relates to the fabrication of a mask for use in the optical lithography of microelectronic circuits. More particularly, it relates to the design of such a mask that utilizes outrigger-type phase shifting and to a simplified process for fabricating said design.

2. Description of the Related Art

The complex patterns that ultimately form the structures of microelectronic circuits must first be transferred to a semiconductor substrate by the process of lithography. Optical lithography is one type of lithographic process, in which the pattern is imaged on the plane of the substrate by passing light through a mask (the photomask) onto the substrate. The details of the pattern are formed by openings in the photomask which are transparent to electromagnetic radiation of some frequency.

The mask itself consists of an optically transparent substrate, typically quartz, which is coated with an optically opaque material, typically chromium. Openings are formed in the opaque material, whose shapes correspond to the microelectronic structures and circuit elements to be fabricated on the semiconductor substrate. Light passing through these openings then falls on a photo-sensitive resist medium that covers the semiconductor substrate, developing it and allowing the delineation of the structures and circuit elements on the substrate.

As the size and spacings of microelectronics structures and circuit elements diminish, so must the corresponding openings in the photomask. This, in turn, causes the transmitted light to form diffraction patterns on the photo-sensitive resist medium, which limits the resolution of the image produced. Several techniques have been applied to improve that resolution, most notably the phase shifting of some or all of the transmitted light along the edges of the photomask openings. Phase shifting an electromagnetic wave means shifting its sinusoidal shape relative to that of an identical reference wave. This can be done by passing the wave through a region of different optical path length than that traversed by the reference wave. A shift of 180 degrees ($\pi$ radians) will cause the peak of the shifted wave to overlay the trough of the reference wave. If such a shifted wave combines with an unshifted wave, at a common image plane, their fields add to zero and the resulting light intensity is zero. It is also possible to attenuate the shifted wave by passing it through an optically absorbing region. If an attenuated, shifted wave is combined with an unattenuated, unshifted wave, only partial cancellation will result.

Significant cancellation of unwanted diffraction lobes at the edges of small mask openings has been achieved by superimposing phase shifted light on the directly transmitted light in such a manner as to cause the phase shifted light to overlay and combine with the diffraction lobes. There are several approaches to achieve this goal, two in particular being rim-type phase shifting and outrigger-type phase shifting. In rim-type phase shifting, a layer of phase shifting material is formed as a narrow band around the inner edge of the mask opening. In outrigger-type phase shifting, a narrow, open annular channel surrounds the mask opening, separated from it by the opaque material that defines the central opening.

Although the efficacy of rim-type and outrigger-type phase shift masks for improving image resolution is accepted in the present art, technical complexities and the cost of such masks has led to a variety of new approaches for fabricating them. In this regard we note the work of Tzu (U.S. Pat. No. 5,853,923) who teaches a method of forming a rim-type attenuating phase shifting mask which requires only a single resist layer and resist developing step. We note also the work of Tzu et al (U.S. Pat. No. 5,888,678) who teach a method for forming a mask that combines a rim-type attenuating phase shift pattern along with a binary mask pattern (not a phase shift type) on the same mask blank. The work of Moon et al (U.S. Pat. No. 5,853,921) teaches a method of more efficiently forming a radiation blocking layer on an alternating phase shift mask by using two different radiation dose levels to develop the resist layer defining the mask pattern. Finally, the work of Lee (U.S. Pat. No. 5,856,049) teaches a method for combining a rim-type phase shift mask portion incorporating two phase shift layers, along with an outrigger-type mask portion, on the same mask.

The present invention teaches a method for significantly reducing the number of steps required in fabricating an outrigger-type phase shift mask. In this respect it differs in its objectives and methods from all the inventions cited above. The method for forming a phase shifting outrigger-type mask according to the present art requires approximately thirteen sequential processing steps. These include two separate depositions of electron-beam sensitive resist layers, with a further deposition of an optically opaque layer on the second resist layer, through which an electron-beam must first pass so as to expose the resist layer beneath. Not only is such a multiplicity of steps inherently costly and time consuming, but the sequential layering of resist layers described above and the subsequent E-beam exposure through a covering opaque layer, requires extremely precise alignment to produce the required pattern definition.

SUMMARY OF THE INVENTION

This invention is a simplified and cost-effective process for fabricating a lithography mask having one portion that transmits direct radiation and another portion that transmits phase shifted and attenuated radiation. In particular, it is a simplified and cost-effective process for fabricating an outrigger type phase shift mask. Outriggers are annular channels that surround and are separated from small, isolated, optically transparent openings in a photomask. When these channels contain an optically attenuating medium that also phase shifts light by approximately 180 degrees relative to the light transmitted by the transparent opening, the light they transmit will cancel the diffraction lobes produced by that opening. In this way, the definition of the pattern imaged by the central transparent opening will be greatly enhanced. In addition, the outrigger type mask has less side lobe effects and less proximity effects than the rim type mask. By teaching a simplified method for fabricating such an outrigger, this invention will allow the fabrication of a mask with significant benefits over rim-type phase shift masks and other outrigger-type masks not fabricated using the method of this invention.

The first object of this invention is to provide a simple and cost-effective method for forming a lithography mask that transmits a pattern having one portion that is is neither phase shifted nor attenuated and another portion that is phase shifted and attenuated.

A second object of this invention is to provide a method for forming an outrigger-type phase shifting photomask in a simple and cost-effective manner.

A third object of this invention is to provide a method for forming an outrigger-type phase shift photomask that will reduce the number of defects in the manufacturing process and improve the capability for inspection, discovery and repair of defects during the mask fabrication process.

These objectives are achieved by using two levels of exposure dosage in the E-beam exposure of the resist layer that covers the mask blank. This double exposure of a single resist layer eliminates the need for two separate E-beam exposures of two separate resist layers and the associated problems of precisely aligning the beams after several intermediate process steps have been carried out. After development, the two exposure levels will have produced openings in the resist layer having different depths. The different depth openings then allow separate etching processes to be used to open up a transparent region in the mask and an attenuating, phase shifting region of the mask. When the mask is an outrigger type phase shift photomask, the transparent region of the mask will be an isolated opening and the attenuated phase shifting region of the mask will be an annular channel that surrounds the central region. The significant reduction in the number of material layers that must be deposited and the number of separate process steps that must be carried out, leads to a reduction of defects in the fabrication process and improves the chances of detecting whatever defects might occur.

Figure 1:
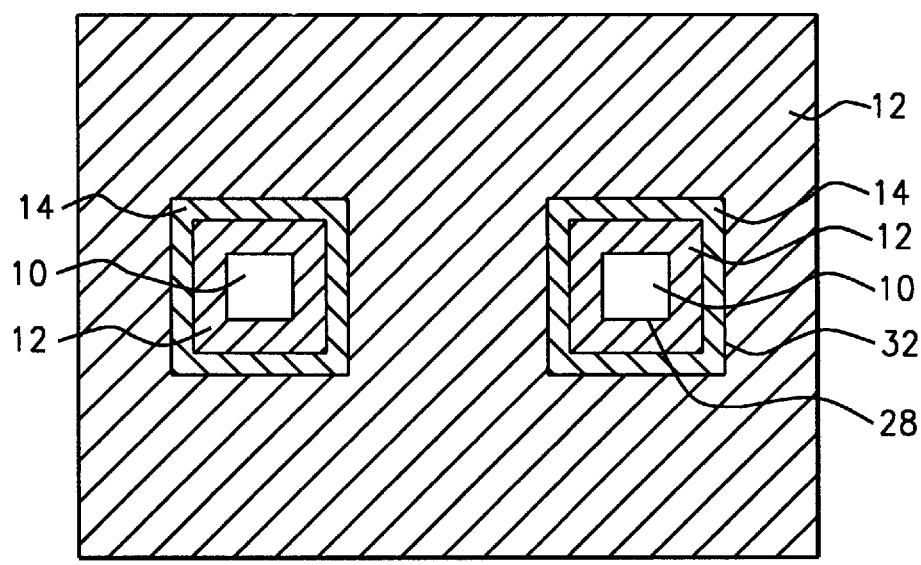
FIG. 1 shows an overhead view of a simplified outrigger-type phase shift mask. The circuit pattern image to be formed consists of two isolated squares. The photomask contains two corresponding square openings (10). The annular channel surrounding (10) is the outrigger and is labeled (14). It is filled with an attenuating phase shifting material. The outrigger is separated from the square opening by a band of opaque material (12).

This figure is a side view of the overhead view in FIG. 1.

DESCRIPTION OF THE PREFERRED EMBODIMENT

Figure 2:
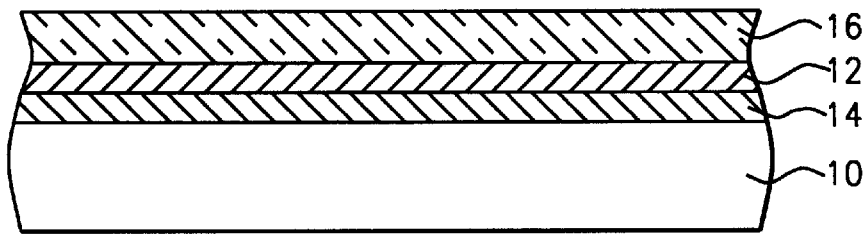
FIG. 2 is a side view of the photomask blank. It consists of a transparent substrate, over which has been successively deposited an attenuating phase shifting layer, an optically opaque layer and a resist layer.

Refer now to FIG. 2 through FIG. 9 for a description of the preferred embodiment of the method of this invention as used for forming an outrigger-type phase shift mask to be used in optical lithography. FIG. 2 shows a cross-section of the mask blank. It consists of a transparent substrate (10), with a layer of attenuating phase shifting material formed thereon (14) and a layer of opaque material (12) formed on this attenuating phase shifting material. In this example, the transparent substrate is a material such as quartz with a thickness between 0.6 cm and 0.7 cm, the attenuating phase shifting material is a layer of MoSiON having a thickness between 700 angstroms and 1500 angstroms and the opaque material is a layer of chromium having a thickness between 500 angstroms and 1000 angstroms. A layer of resist (16) is formed on the photomask blank. In this example, the resist is sensitive to exposure by E-beam energy.

Figure 3:
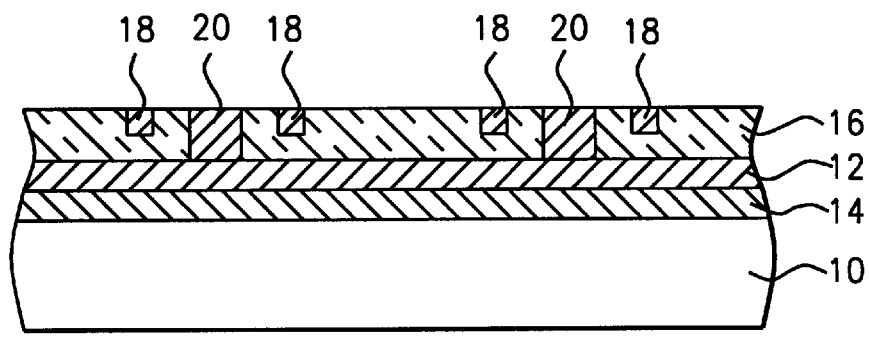
FIG. 3 shows the photomask blank after the resist layer was exposed by two levels of deposited E-beam energy. The high energy exposure extends to the opaque layer, the low energy exposure penetrates less deeply into the resist layer.

FIG. 3 shows the resist coated (16) photomask blank after being subjected to two levels of exposure energy (shaded regions (18) and (20)). In this example the exposure is E-beam exposure by a 50 kev E-beam system and the two energy depositions correspond to 20 $\mu C/cm^2$ and 9 $\mu C/cm^2$. The higher energy deposition exposes the resist to its full thickness (20). The lower energy exposes the resist to an intermediate depth (18).

Figure 4:
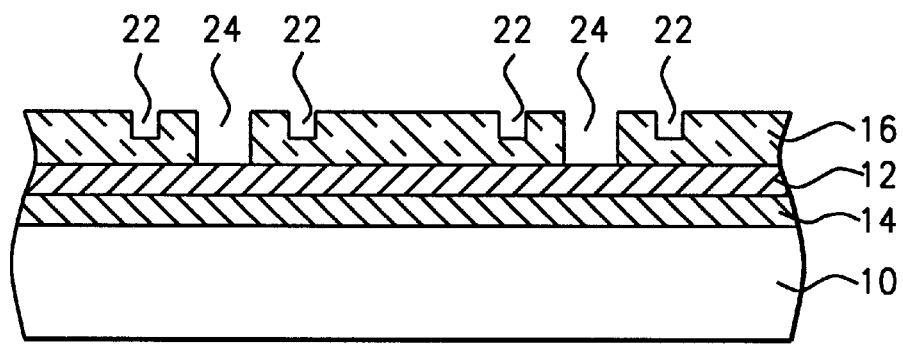
FIG. 4 shows the removal of the exposed resist by developing and baking.

FIG. 4 shows the results of developing and baking the exposed resist layer. The exposed regions are removed and openings into the resist are formed. The deeper openings (24) extend to the opaque layer (12), which is the second of the two layers covering the mask substrate. The shallower openings (18) extend to an intermediate depth.

Figure 5:
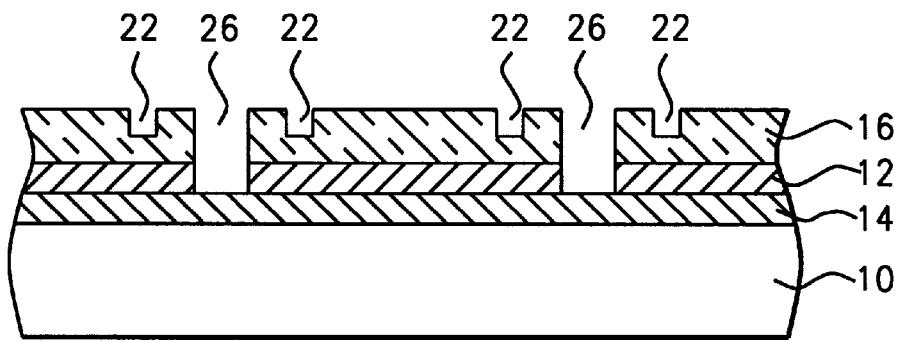
FIG. 5 shows the results of etching away the opaque layer by applying an etching solution through the deeper opening in the resist layer.

FIG. 5 shows the photomask blank after the application of a wet or dry etch to the opaque layer (12) exposed by the removal of the developed resist (24). The wet etch could be a solution such as $HClO_4$ or $Cl(NH)_4(NO_3)_6$, the dry etch could be a gas such as $Cl_2/O_2$. The opaque layer is etched away to expose the attenuating phase shifting layer below (14).

Figure 6:
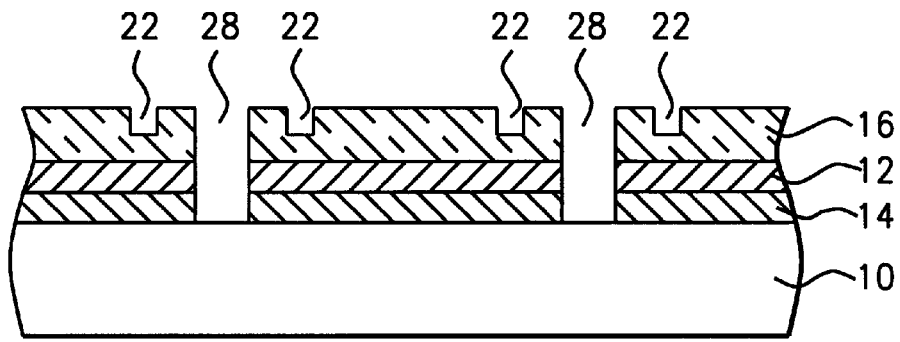
FIG. 6 shows the results of applying a dry etch to the attenuating phase shifting material just beneath the opaque layer. The transparent substrate is now exposed.

FIG. 6 shows the photomask after the application of a dry etch, such as $CF_4/O_2$ to remove the attenuating phase shifting layer below the opaque layer. The opening into the resist now extends to the surface of the transparent substrate (28).

Figure 7:
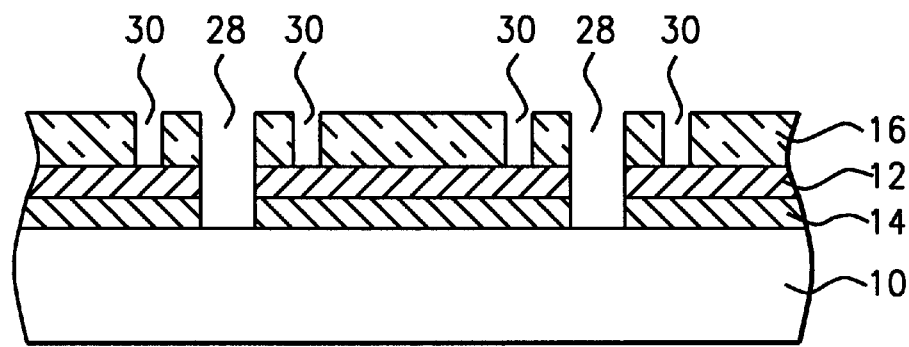
FIG. 7 shows the results of applying an anisotropic, highly selective oxygen plasma etch that etches down the intermediate depth openings in the resist to expose the opaque layer.

FIG. 7 shows the photomask after the application of an anisotropic, selective etch by an oxygen plasma. This etch deepens the intermediate depth openings in the resist until the opaque layer is exposed (30).

Figure 8:
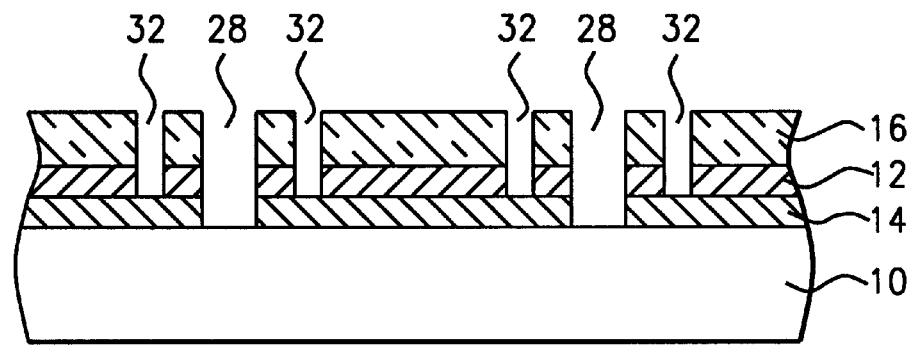
FIG. 8 shows the removal of the opaque layer by a dry etch or a wet etch.

FIG. 8 shows the photomask after a dry or wet etch removes the opaque layer ((30) in FIG. 7) and exposes the attenuating phase shifting layer beneath it (32).

Figure 9:
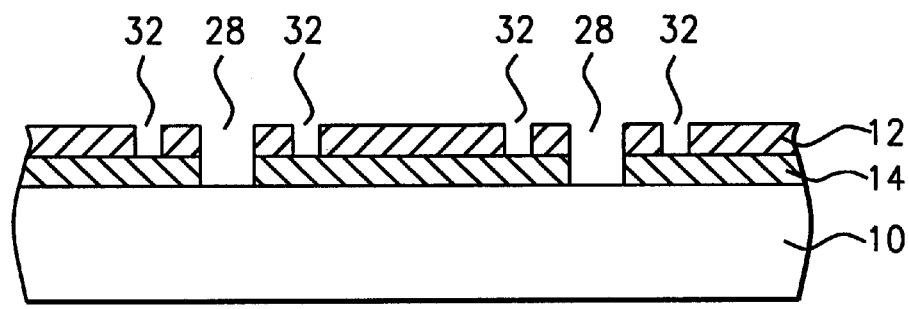
FIG. 9 shows the completed mask, with the remaining resist layer stripped away.

FIG. 9 shows the photomask after the remaining resist layer has been removed. The photomask is now complete and represents a cross-section of the photomask depicted in FIG. 1. The central transparent portions of the two square openings in FIG. 1 are represented by the two openings (28) and the surrounding outrigger portion is represented in cross-sectional view by the four openings (32). The light passing through (28) passes only through the transparent substrate. Light passing through the outrigger passes also through the attenuating phase shifting layer.

As is understood by a person skilled in the art, the preferred embodiment and examples of the present invention are illustrative of the present invention rather than limiting of it. Revisions and modifications may be made to processes, structures and dimensions through which is fabricated, by a simplified, cost-effective process, an outrigger type phase shift mask in accord with the preferred embodiment and examples of the present invention while still providing such an outrigger type phase shift mask in accord with the present invention and appended claims.

What is claimed is:

1. A method of forming a mask, comprising the steps of:
    providing a mask substrate;
    forming a first mask layer on said substrate;
    forming a second mask layer on said first mask layer;
    forming a layer of energy sensitive resist over said second mask layer;
    transferring a certain first portion of a pattern to said resist by depositing energy of such an amount that the resist is exposed to its maximum depth;
    transferring a certain second portion of a pattern to said resist by depositing energy of a lesser amount;
    developing the exposed portions of the resist and removing them;
    removing the second mask layer that is exposed by the deeper of the two openings in the resist;
    removing the first mask layer that is exposed by the removal of said second mask layer;
    increasing the depth of the shallower openings in the resist by use of a selective, anisotropic etchant until the second mask layer is exposed;
    removing said second mask layer by a dry or wet etch;
    stripping away the remaining resist layer.

2. The method of claim 1 wherein the mask substrate is an optically transparent substrate.

3. The method of claim 2 wherein the optically transparent substrate is a quartz substrate having a thickness between 0.6 cm and 0.7 cm.

4. The method of claim 1 wherein the first mask layer is an optically attenuating and phase shifting layer.

5. The method of claim 4 wherein the optically attenuating layer is a layer of MoSiNO of thickness between 700 angstroms and 1500 angstroms.

6. The method of claim 1 wherein the second mask layer is an optically opaque layer.

7. The method of claim 6 where the optically opaque layer is a chromium layer of thickness between 500 angstroms and 1000 angstroms.

8. The method of claim 1 wherein the resist is sensitive to exposure by E-beam energy.

9. The method of claim 1 wherein the first part of the pattern corresponds to the structures whose images are to be transferred by unattenuated and un-phase shifted radiation.

10. The method of claim 9 where the first part of the pattern is transferred by a 50 kev E-beam system with an exposure of the resist medium corresponding to 20 $\mu C/cm^2$.

11. The method of claim 1 wherein the second part of the pattern corresponds to the part of the pattern which is to be transferred by attenuated and phase shifted radiation.

12. The method of claim 11 wherein the second part of the pattern is transferred by a 50 kev E-beam system with an exposure of the resist medium corresponding to 9 $\mu C/cm^2$.

13. The method of claim 1 wherein the second mask layer is removed with a chromium wet etch of $HClO_4$ or $Cl(NH)_4(NO_3)_6$.

14. The method of claim 1 wherein the first mask layer is removed with a dry etch of $CF_4/O_2$.

15. The method of claim 1 wherein the selective, anisotropic etch is an oxygen plasma etch.

16. The method of claim 1 wherein the second mask layer is removed with a chromium dry etch of $Cl_2/O_2$.

17. A method of forming an outrigger type phase shifting mask, comprising the steps of:
    providing a mask substrate;
    forming a first mask layer on said substrate;
    forming a second mask layer on said first mask layer;
    forming a layer of energy sensitive resist over said second mask layer;
    transferring to said resist a certain first portion of a pattern, which is an isolated image, by depositing energy of such an amount that the resist is exposed to its maximum depth;
    transferring to said resist a certain second portion of a pattern, which is an annular outrigger channel surrounding said first portion of the pattern, by depositing energy of a lesser amount;
    developing the exposed portions of the resist and removing them;
    removing the second mask layer that is exposed by the deeper of the two openings in the resist;
    removing the first mask layer that is exposed by the removal of said second mask layer;
    increasing the depth of the shallower openings in the resist by use of a selective, anisotropic etchant until the second mask layer is exposed;
    removing said second mask layer by a dry or wet etch;
    stripping away the remaining resist layer.

18. The method of claim 17 wherein the mask substrate is an optically transparent substrate.

19. The method of claim 18 wherein the optically transparent substrate is a quartz substrate having a thickness between 0.6 cm and 0.7 cm.

20. The method of claim 17 wherein the first mask layer is an optically attenuating and phase shifting layer.

21. The method of claim 20 wherein the optically attenuating layer is a layer of MoSiNO of thickness between 700 angstroms and 1500 angstroms.

22. The method of claim 17 wherein the second mask layer is an optically opaque layer.

23. The method of claim 22 where the optically opaque layer is a chromium layer of thickness between 500 angstroms and 1000 angstroms.

24. The method of claim 17 wherein the resist is sensitive to exposure by E-beam energy.

25. The method of claim 24 where the first part of the pattern is transferred by a 50 kev E-beam system with an exposure of the resist medium corresponding to 20 $\mu C/cm^2$.

26. The method of claim 24 wherein the second part of the pattern is transferred by a 50 kev E-beam system with an exposure of the resist medium corresponding to 9 $\mu C/cm^2$.

27. The method of claim 17 wherein the second mask layer is removed with a chromium wet etch of $HClO_4$ or $Cl(NH)_4(NO_3)_6$.

28. The method of claim 17 wherein the first mask layer is removed with a dry etch of $CF_4/O_2$.

29. The method of claim 17 wherein the selective, anisotropic etch is an oxygen plasma etch.

30. The method of claim 17 wherein the second mask layer is removed with a chromium dry etch of $Cl_2/O_2$.

* * * * *